United States Patent
Wey et al.

(10) Patent No.: US 6,445,212 B1
(45) Date of Patent: Sep. 3, 2002

(54) HIGH-SPEED, LOW-NOISE, IMPEDANCE-MATCHED OUTPUT BUFFER CIRCUIT

(75) Inventors: Meng-Jer Wey, Hsinchu (TW); Chu Yu Chin, Chu-Pei (TW)

(73) Assignee: Faraday Technology Corp., Hsinchu (TW)

(*) Notice: Subject to any disclaimer, the term of this patent is extended or adjusted under 35 U.S.C. 154(b) by 0 days.

(21) Appl. No.: 09/829,231

(22) Filed: Apr. 9, 2001

(30) Foreign Application Priority Data

Jan. 12, 2001 (TW) .......................................... 90100700

(51) Int. Cl.[7] .......................................... H03K 19/0175
(52) U.S. Cl. .............................. 326/87; 326/26; 326/27
(58) Field of Search .............................. 326/26, 27, 86, 326/87

(56) References Cited

U.S. PATENT DOCUMENTS

| | | | | |
|---|---|---|---|---|
| 4,820,942 A | * | 4/1989 | Chan | 307/542 |
| 5,528,166 A | * | 6/1996 | Iikbahar | 326/27 |
| 6,066,958 A | * | 5/2000 | Taniguchi et al. | 326/27 |

* cited by examiner

Primary Examiner—Michael Tokar
Assistant Examiner—Anh Q. Tran
(74) Attorney, Agent, or Firm—J.C. Patents (57) ABSTRACT

A programmable multi-configuration output buffer circuit having an input port terminal and an output port terminal. The output buffer circuit includes an output buffer stage having no delay unit and one or more output buffer stages having a delay unit. The output buffer stage having no delay unit includes a first type channel pull up transistor, a second type channel pull down transistor and a first logic circuit. The drain terminal of the first type channel pull up transistor and the second type channel pull down transistor are connected together and connected with the output port as well. The first logic circuit receives an enable signal and an input signal. The output buffer stage having a delay unit therein includes a first type channel pull up transistor, a second type channel pull down transistor and a second logic circuit. The drain terminal of the first type channel pull up transistor and the second type channel pull down transistor are connected together and connects with the output port as well. The second logic circuit is connected to the enable signal, the input signal and a corresponding select enable signal. The output buffer circuit may further includes a programmable storage unit for controlling output configuration. When the output buffer circuit is programmed, select enable signals can be outputted so that a portion of the output buffer stages having a delay unit can be triggered.

11 Claims, 11 Drawing Sheets

HIGH-SPEED, LOW-NOISE, IMPEDANCE-MATCHED OUTPUT BUFFER CIRCUIT

CROSS-REFERENCE TO RELATED APPLICATION

This application claims the priority benefit of Taiwan application serial no. 90100700, filed Jan. 12, 2001.

BACKGROUND OF THE INVENTION

1. Field of Invention

The present invention relates to an output device. More particularly, the present invention relates to an output device capable of increasing both driving capacity and small voltage slew rate and permitting on-chip programming through a storage unit. Ultimately, the output device has an output impedance, a driving capacity, a voltage slew rate, and an output waveform closer to the desired specifications.

2. Description of Related Art

In high-speed integrated circuit designs, the driving capacity, the matching of output impedance and other specifications such as the voltage slew rate of an output buffer is very important. To obtain a better design, a number of ways have been developed, for example, in U.S. Pat. No. 5,974,476 and 5,162,672. However, these methods cannot support a high driving capacity small output impedance and a low driving capacity small voltage slew rate at the same time. In addition, the output waveform is highly unsymmetrical due to device characteristics or often leads to a relatively high noise ratio due to unmatched impedance on the transmission line. In U.S. Pat. No. 4,820,942, an output driving circuit that incorporates both AC and DC current is introduced. By combining AC and DC circuits into a single configuration, an AC circuit can be triggered for a pre-defined period according to preset conditions. However this circuit can only attain a fixed driving and delay capacity. Furthermore, since the AC portion of the circuit is in action for a brief period only, overall benefits to output impedance matching is limited.

In brief, the aforementioned circuit designs cannot support a high driving capacity small output impedance, and a low driving capacity small voltage slew rate at the same time. In addition, a mismatch between an externally connected circuit and the output impedance of the buffer may generate unwanted transmission line noise.

SUMMARY OF THE INVENTION

Accordingly, one object of the present invention is to provide an output buffer circuit that supports a high capacity small output impedance and a small driving capacity voltage slew rate for reducing ground bounces and transient voltage drop.

A second object of this invention is to provide a high-speed, low-noise and impedance matched output buffer circuit whose output waveform is symmetrical.

A third object of this invention is to provide a high-speed, low-noise output buffer circuit capable of fine impedance matching so that noise interference due to reflection on a transmission line noise is minimized.

To achieve these and other advantages and in accordance with the purpose of the invention, as embodied and broadly described herein, the invention provides a high-speed, low-noise, impedance-matched programmable multiple configuration output buffer circuit. The output buffer circuit has an input port terminal and an output port terminal. The programmable multiple configuration output buffer circuit at least includes an output buffer stage having no delay unit, and one or more output buffer stages having a delay unit. The output buffer stage having no delay unit includes a first type channel pull up transistor, a second type channel pull down transistor and a first logic circuit. The drain terminal of the first type channel pull up transistor and the second type channel pull down transistor are connected together. The drain terminal of the pull up and pull down transistor are also connected to the output port of the programmable multiple configuration output buffer circuit. The first logic circuit receives an enable signal and an input signal. The output buffer stage having a delay unit therein includes a first type channel pull up transistor, a second type channel pull down transistor, and a second logic circuit. The drain terminal of the first type channel pull up transistor and the second type channel pull down transistor are connected together. The drain terminal of the pull up and pull down transistor are also connected to the output port. The second logic circuit is connected to the enable signal, the input signal, and a corresponding select enable signal.

This invention may also incorporate a storage device. The storage device can be used for setting the driving capacity of the delay unit inside the output buffer. Furthermore, the setting can be done after chip production so that low yield resulting from processing drifts can be avoided.

In brief, this invention provide an output buffer circuit that supports a high capacity small output impedance and a small driving capacity voltage slew rate simultaneously. In the meantime, a symmetrical output waveform can be produced and output impedance can be adjusting to match a transmission line so that noise is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
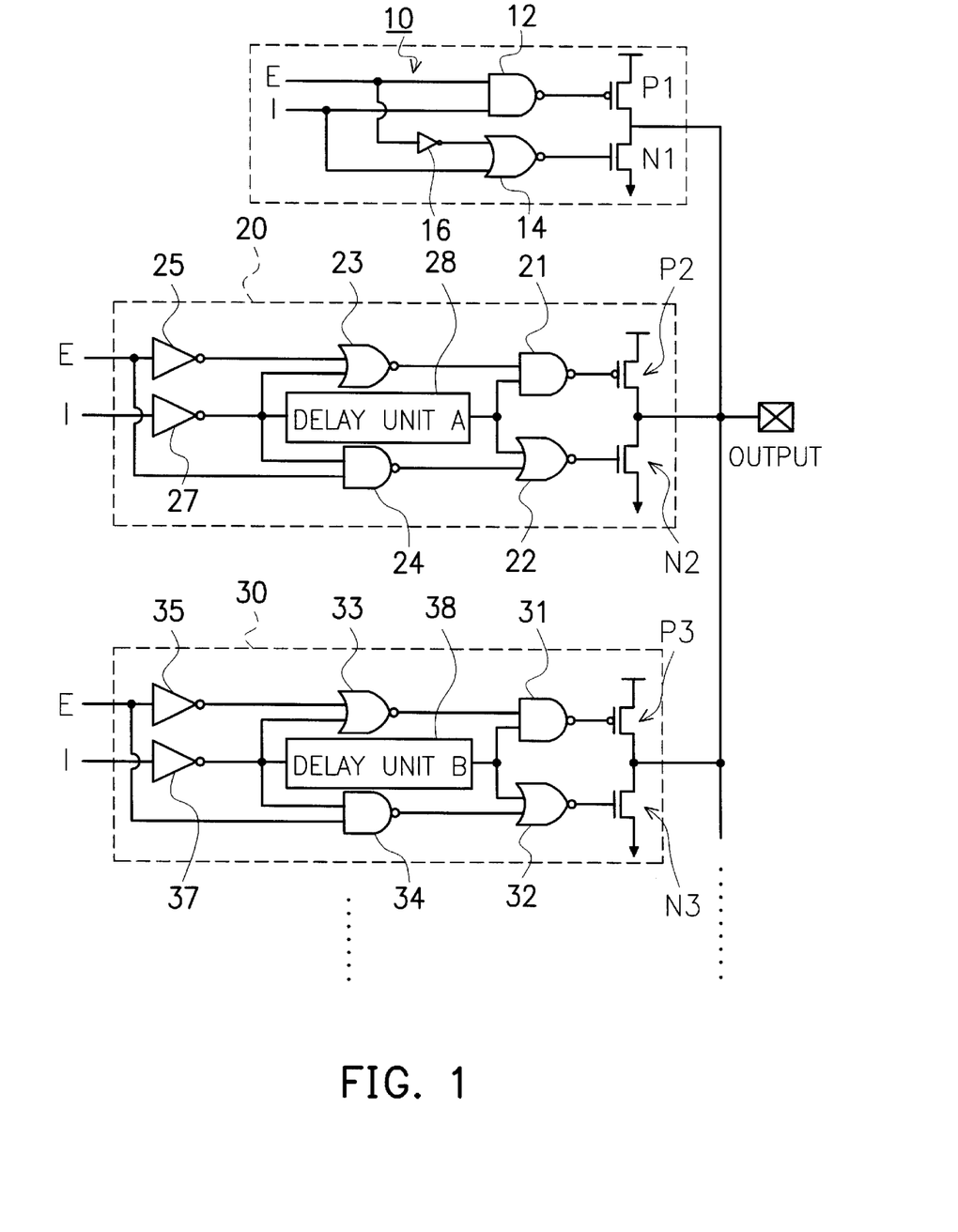
FIG. 1 is an equivalent circuit diagram for an output buffer circuit according to a first embodiment of this invention.

FIG. 1 is an equivalent circuit diagram for an output buffer circuit according to a first embodiment of this invention. As shown in FIG. 1, the buffer circuit includes an output buffer stage 10 having no delay unit and one or more output buffer stages each having a delay unit (20, 30, ..., and so on).

The output buffer stage 10 that has no delay unit therein includes a P-channel MOS pull up transistor P1, and an N-channel MOS pull down transistor N1. The transistors P1 and N1 respond to the switching action of a logic circuit. The logic circuit includes a NAND gate 12, a NOR gate 14 and an inverter 16. The transistors P1 and N1 are serially connected together. A terminal of the transistor P1 is connected to a voltage source Vcc. A terminal of the transistor N1 is connected to an earth terminal. The node that connects the transistor P1 and N1 together is connected to the output port of the output buffer circuit.

The NAND gate 12 receives an enable signal E and an input signal I and sends an output signal to the gate terminal of the pull up transistor P1. The enable signal E passes through the inverter 16 before going into a terminal of the NOR gate 14. The NOR gate 14 receives the input signal I and the inverted enable signal and sends an output signal to the gate terminal of the pull down transistor N1.

The output buffer stage 20 with a delay unit includes a P-channel MOS pull up transistor P2 and an N-channel pull down transistor N2. The transistors P2 and N2 responds to the switching action of a logic circuit. The logic circuit includes NAND gates 21, 24, NOR gates 22, 23, an inverter 27 and a delay unit 28. The transistors P2 and N2 are serially connected together. A terminal of the transistor P2 is connected to a voltage source Vcc. A terminal of the transistor N2 is connected to an earth terminal. The node joining the transistors P2 and N2 is connected to the output port of the output buffer circuit.

The enable signal E is connected to an input terminal of the NOR gate 23 and an input terminal of the NAND gate 24. The input terminal I passes through the inverter 27 before going to an input terminal of the NOR gate 23, the delay unit 28 and an input terminal of the NAND gate 24. The output terminal of the NOR gate 23 and the output terminal of the delay unit 28 are connected to the respective input terminals of the NAND gate 21. Similarly, the output terminal of the NAND gate 24 and the output terminal of the delay unit 28 are connected to the respective input terminals of the NOR gate 22. The output of the NAND gate 21 and the output of the NOR gate 22 are sent to the gate of the large dimensional transistors P2 and N2 respectively. Through the output of the NAND gate 21 and the NOR gate 22, opening and closing of the transistors P2 and N2 is controlled.

The output buffer stage 30 with delay unit includes a P-channel MOS pull up transistor P3 and an N-channel pull down transistor N3. The transistors P3 and N3 responds to the switching action of a logic circuit. The logic circuit includes NAND gates 31, 34, NOR gates 32, 33, an inverter 37 and a delay unit 38. The transistors P3 and N3 are serially connected together. A terminal of the transistor P3 is connected to a voltage source Vcc. A terminal of the transistor N3 is connected to an earth terminal. The node joining the transistors P3 and N3 is connected to the output port of the output buffer circuit.

The logic circuit portion of the output buffer stage 30 is identical with the output buffer stage 20. Hence, detail description of the layout is not repeated here. The output buffer stage 30 receives the enable signal E and input signal I so that the opening or closing of the transistors P3 and N3 and ultimately the output signal from the output buffer circuit is controlled.

According to the circuit shown in FIG. 1, on-chip programming is not available. When the buffer circuit receives an enable signal E, the output buffer stage 10 and all the other output buffer stages 20, 30, ..., and so on are activated altogether. Hence, driving capacity is constant. To permit applications in other circuits, the layout in FIG. 1 must be modified so that a range of driving capacities is available.

Figure 1A:
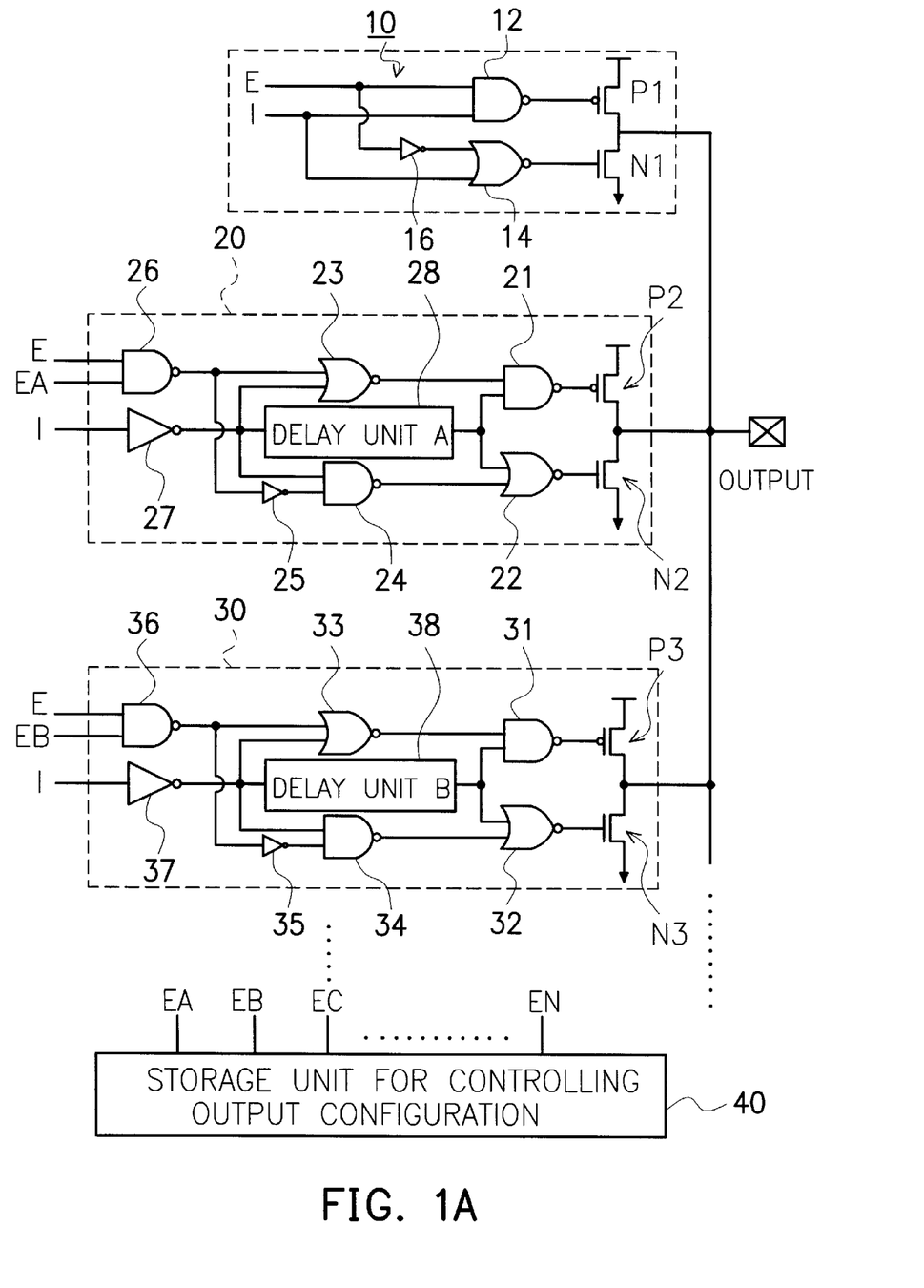
FIG. 1A is an equivalent circuit diagram for a programmable version of the output buffer circuit shown in FIG. 1.

FIG. 1A is an equivalent circuit diagram for a programmable version of the output buffer circuit shown in FIG. 1. To achieve programmability, each delay unit of the output buffer stages 20, 40 and so on is modified. Taking buffer stage 20 as an example, besides receiving an enable signal E and an input signal I, the buffer stage 20 also receives a select enable signal EA. The select enable signal EA is used for selective triggering of output buffer stages. The select enable signal EA and the enable signal E are sent to the input terminals of a NAND gate 26. The output signal from the NAND gate 26 is sent to an input terminal of the NOR gate 23 and an input terminal of the inverter 25. The inverted signal of the inverter 25 is sent to an input terminal of the NAND gate 24. The remaining structure is identical to the one shown in FIG. 1, hence a detailed description is not repeated here.

The number of output buffer stages with delay units can be increased by joining them in parallel with the output ports of the programmable multiple configuration output buffer circuit. Each output buffer stage receives an enable signal E, a select enable signal Ei (such as select enable signal EA and EB) and an input signal I. The output driving capacity of each output buffer stage (10, 20, 30, ..., and so on) can be self-determined. For example, the output buffer stage 10 having no delay unit can have an output driving current of 4 mA while the output buffer stages 20 and 30 can have output driving currents of 2 mA and 4 mA respectively. The output driving currents of subsequent stages can be 6 mA, 8 mA and so forth.

The introduction of a select enable signal Ei permits the triggering of desired output buffer stages. For example, when the select enable signal EA is at a high potential, the output buffer stage 20 is activated. Similarly, when the select enable signal EB is at a high potential, the output buffer stage 30 is activated. The selection of any output buffer stage can be organized through a storage unit 40 for controlling output configuration. The storage unit 40 has a plurality of select enable signal lines EA, EB, ..., EN. By programming the storage unit 40, the required output buffer stages are selected. For example, output stages such as 10 and 20 having an output driving current 4 mA (no delay output)+2 mA (having delay output) may be selected. Alternatively, output stages such as 10 and 30 having an output driving current 4 mA (no delay output)+4 mA (having delay output) may be selected.

Furthermore, the storage unit can be used to store the required output configuration so that an on-chip programming may be carried out to set up an ideal output configuration after IC fabrication.

Figure 2A:
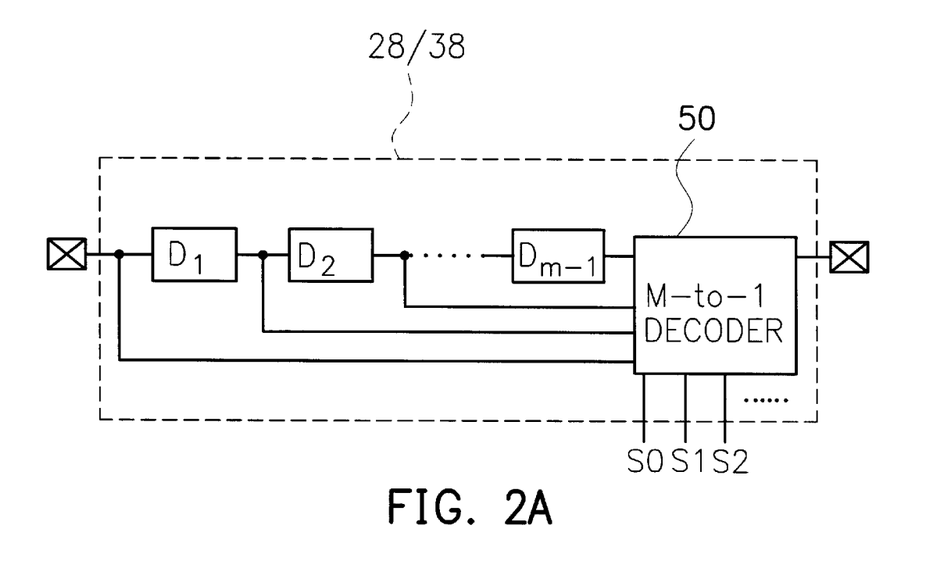
FIG. 2A is a block diagram showing the delay unit shown in FIG. 1.

In the aforementioned output buffer stages 20 and 30, the delay units 28 and 38 can also be replaced by programmable circuits so that the delay in each output buffer stage may be adjusted. FIG. 2A is a block diagram showing the delay unit shown in FIG. 1. As shown in FIG. 2A, the delay unit 28/38 comprises one or more (for example, m number of) delay circuits $D_1$, $D_2$, ..., $D_{m-1}$ and an m-to-1 decoder 50. The delay circuits $D_1$, $D_2$, ..., $D_{m-1}$ are serially connected to the m-to-1 decoder 50. The m-to-1 decoder 50 also has a plurality of signal input terminals connected to the output terminals of various delay circuits $D_1$, $D_2$, ..., $D_{m-1}$, the output of the inverter 27/37 and various select signal lines S0, S1, S2 and so on. By on-chip programming, signals can be sent to the select signal lines S0, S1, S2 and so on for obtaining a delay ranging from zero to m periods. Consequently, a preset delay can be programmed into those output buffer stages having a delay unit so that the circuit has a greater flexibility in actual applications.

Figure 2B:
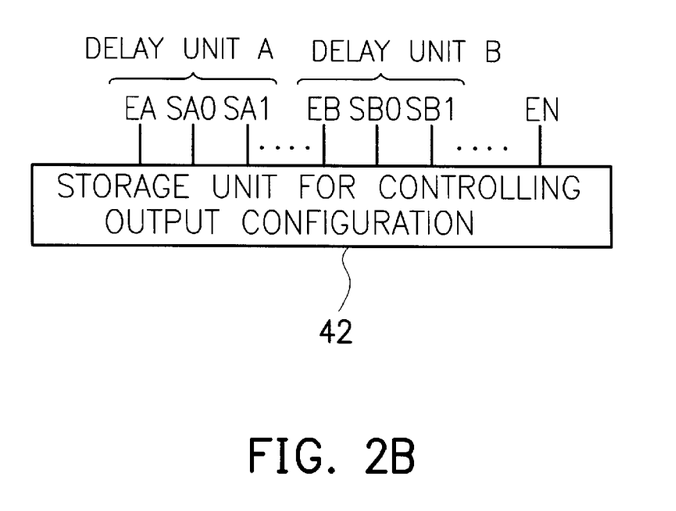
FIG. 2B is a diagram showing the control pins of a storage unit for output configuration that corresponds with the circuit in FIG. 2A.

To implement the programmable circuit, the storage device 40 for output configuration control shown in FIG. 1A is modified into the one shown in FIG. 2B. Aside from the select enable signals EA, EB, ... and so on, the storage unit 42 further includes select signals S0, S1, S2, ... for selecting delay timing. Hence, the circuit not only permits the programming of driving capacity, but also programming of delay timing as well.

Figure 3:
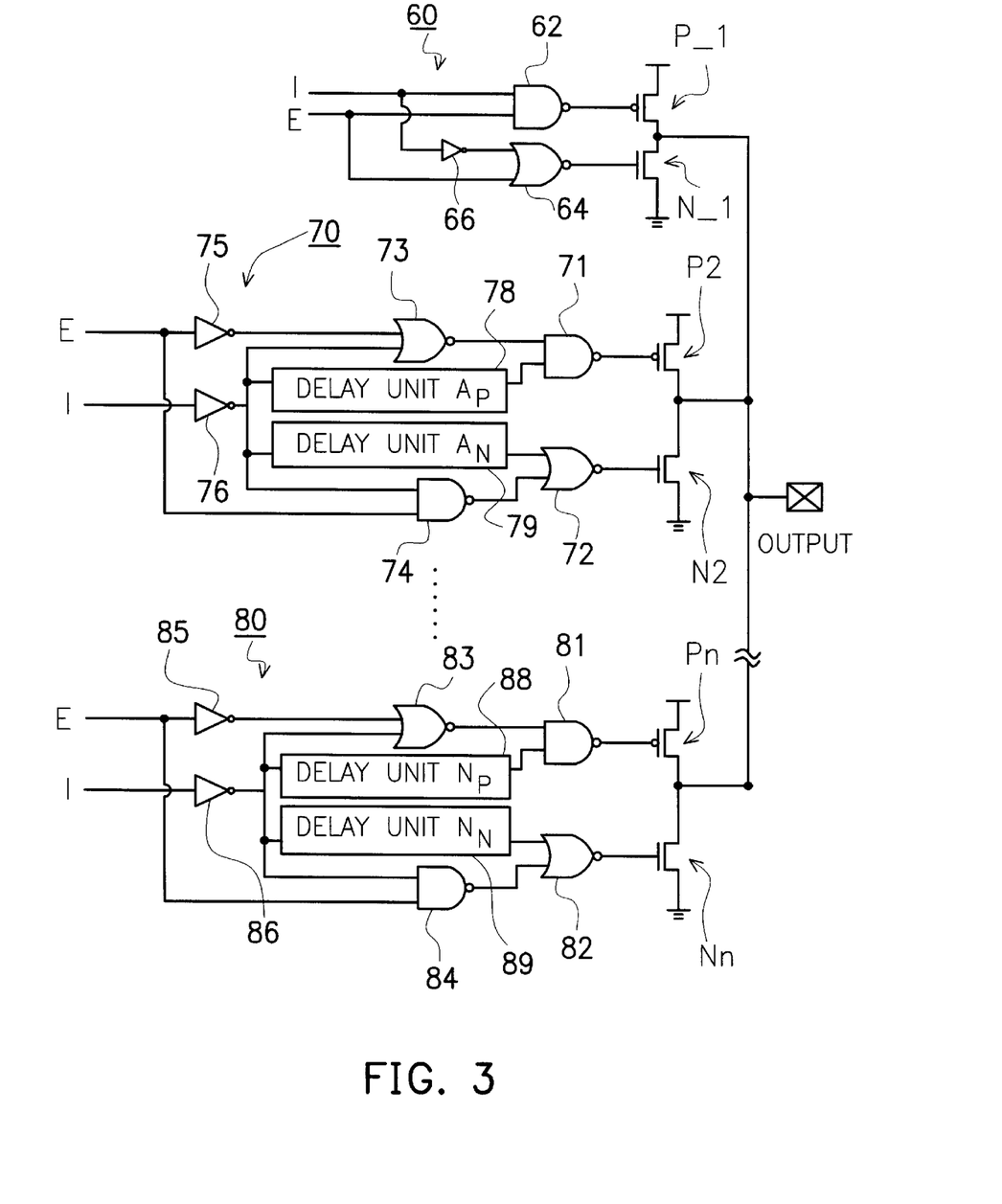
FIG. 3 is an equivalent circuit diagram for a programmable multiple configuration output buffer circuit according to a second preferred embodiment of this invention.

FIG. 3 is an equivalent circuit diagram for a programmable multi-configuration output buffer circuit according to a second preferred embodiment of this invention. The second embodiment is very similar to the first embodiment except for the design of the delay unit.

As shown in FIG. 3, the programmable multi-configuration output buffer circuit includes an output buffer stage 60 without a delay unit and one or more output stages such as 70, ..., 80 each having a delay unit. The output buffer stage 60 and the output buffer stages 70, ..., 80 have an electrical configuration identical to the one shown in FIG. 1 and hence detail description is not repeated here.

One major difference between the circuit in FIG. 1 and FIG. 3 is that the delay unit in FIG. 3 is divided into two separate delay units. For example, the output buffer stage 70 contains a first delay unit 78 and a second delay unit 79. After the input signal I is inverted by an inverter 76, the inverted signal is transferred to both delay units 78 and 79. An output terminal of the delay unit 78 is connected to an input terminal of a NAND gate 71 and the output terminal of the NAND gate 71 is connected to the gate terminal of a transistor P2. Similarly, an output terminal of the delay unit 79 is connected to an input terminal of a NOR gate 72 and the output terminal of the NOR gate 72 is connected to the gate terminal of a transistor N2. In other words, the original transistors P2 and N2 are adjusted by the same delay unit, but now the transistors P2 and N2 are controlled separately by the delay unit 78 and 79.

Figure 3A:
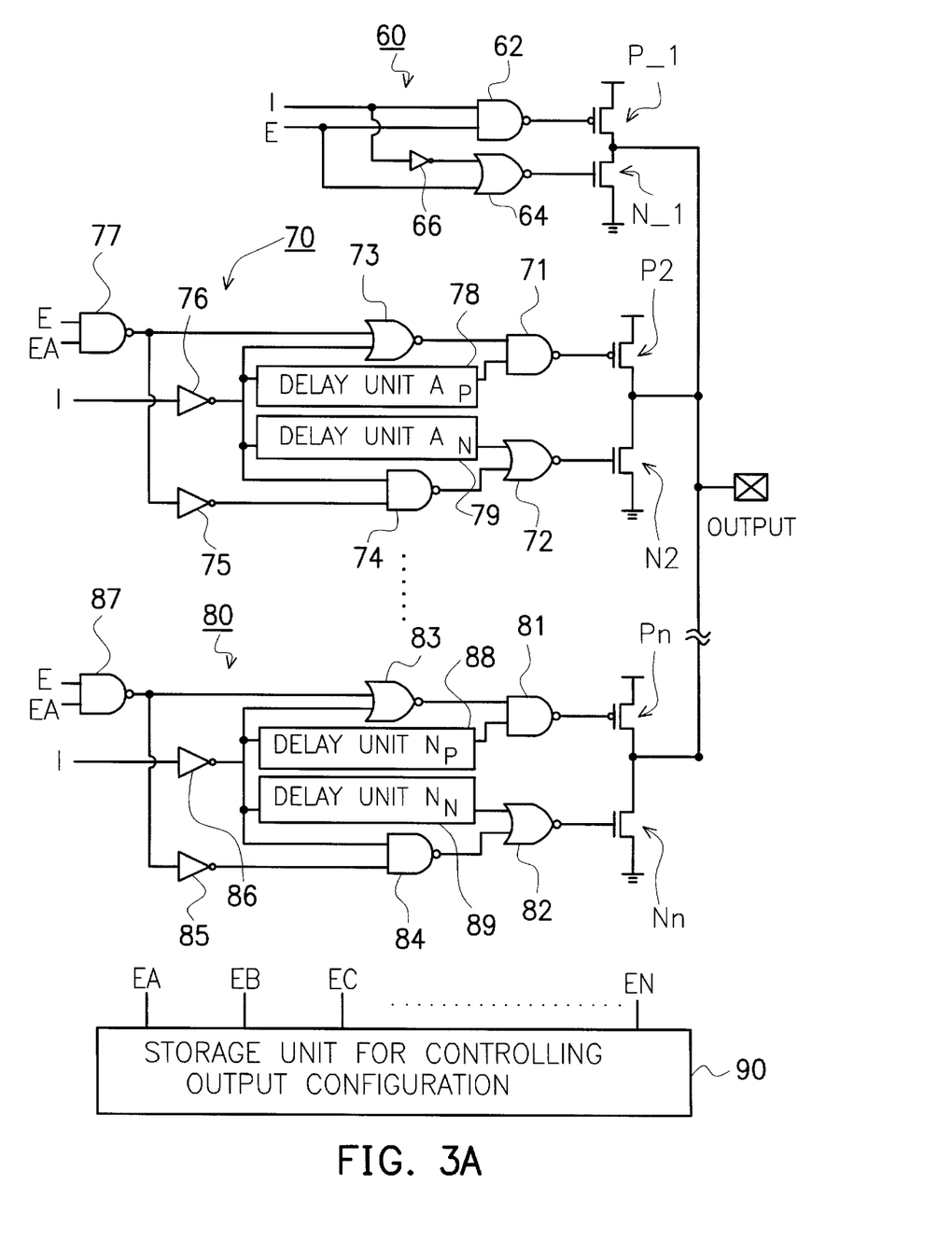
FIG. 3A is an equivalent circuit diagram for a programmable version of the output buffer circuit shown in FIG. 3.

Aside from the design of the delay unit, method of operating the circuits in the second embodiment is almost identical to the first embodiment of this invention. A programmable design that corresponds to the circuit in FIG. 3 is shown in FIG. 3A. As shown in FIG. 3A, programmable design is incorporated into the delay unit $A_P$ 78 and the delay unit $A_N$ 79.

FIG. 3A is an equivalent circuit diagram for a programmable version of the output buffer circuit shown in FIG. 3.

To implement the programmable circuit, the delay unit in each output buffer stage such as 70, 80, ... and so on is modified. The method of modification is similar to the modification of the delay unit of the output buffer stages 20, 30, ... and so on as shown in FIG. 1A. Here, detail description is not repeated.

Figure 3B:
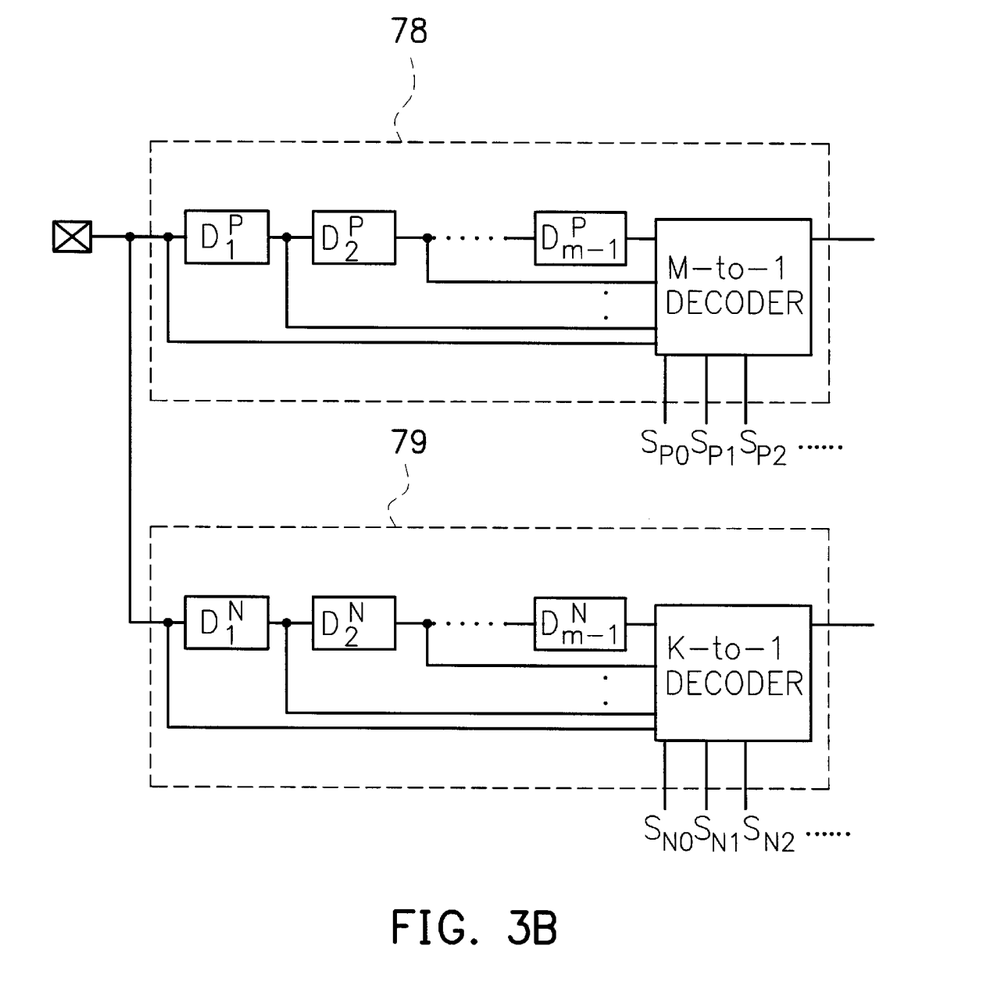
FIG. 3B is a block diagram of a delay unit shown in FIG. 3.

As shown in FIG. 3A, the storage unit 90 for output configuration control may include output select enable signals EA, EB, ..., EN for selecting the desired output stages. In addition, a programmable design may be incorporated into the delay units 78 and 79 just like the example in FIG. 2A. Each of the two delay units can have a stage level. For example, both delay units 78 and 79 have m delay circuits. However, each delay unit can also have a different number of delay circuits. FIG. 3B is a block diagram of a delay unit shown in FIG. 3. Using an output buffer stage 70 as an example, the delay unit 78 has m delay circuits $D^P_1$, $D^P_2$, ..., $D^P_{m-1}$ and an m-to-1 decoder. The m-to-1 decoder uses signal lines $S_{P0}$, $S_{P1}$, ... to select the number of delay circuits and delay timing. Similarly, the delay unit 79 has k delay circuits $D^P_1$, $D^P_2$, ..., $D^P_{k-1}$, and an k-to-1 decoder. The k-to-1 decoder uses signal lines $S_{N0}$, $S_{N1}$, ... to select the number of delay circuits and delay timing. Consequently, different delay timing can be used to drive the transistors P2 and N2.

Figure 3C:
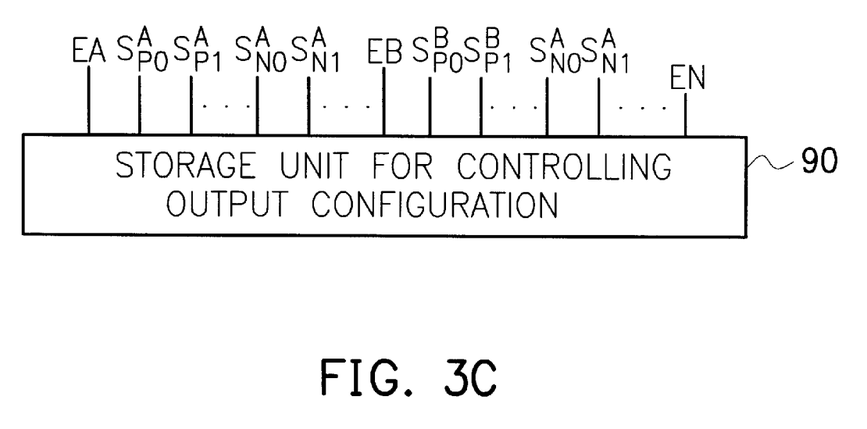
FIG. 3C is a diagram showing the control pins of a storage unit for output configuration that corresponds with the circuits in FIGS. 3A and 3B.

With the aforementioned circuit architecture, the storage unit 90 for controlling output configuration in FIG. 3A can be modified into the one shown in FIG. 3C. Aside from the output select enable signals EA, EB, ..., EN for selecting the output stages, select signals can also be sent to each delay unit. For example, in FIG. 3C, for each output buffer stage (the $i^{th}$, where i–A~N) having a delay unit, the storage unit 90 can output a select enable signal Ei to select corresponding output buffer stages. Moreover, the storage unit 90 can also issue a group of delay select signals $S^i_{P0}$, $S^i_{P2}$, $S^i_{P2}$ ... (for example, corresponding to the delay unit 78) and a group of delay select signals $S^i_{N0}$, $S^i_{N1}$, $S^i_{N2}$ ... (for example, corresponding to the delay unit 79) so that delay timing for each of the delay units 78 and 79 can be independently set.

Figure 4A:
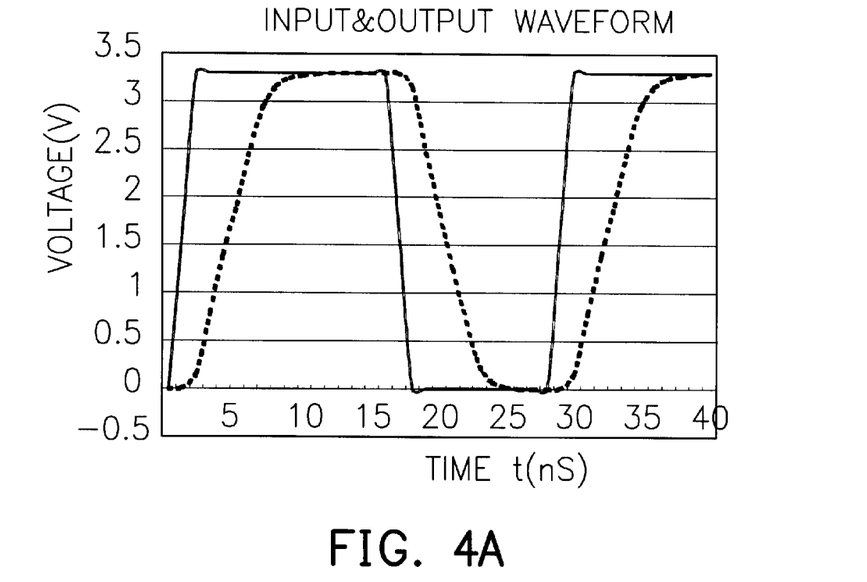
FIGS. 4A through 4C are graphs showing the results of simulating the circuits according to the embodiments of this invention.
Figure 4B:
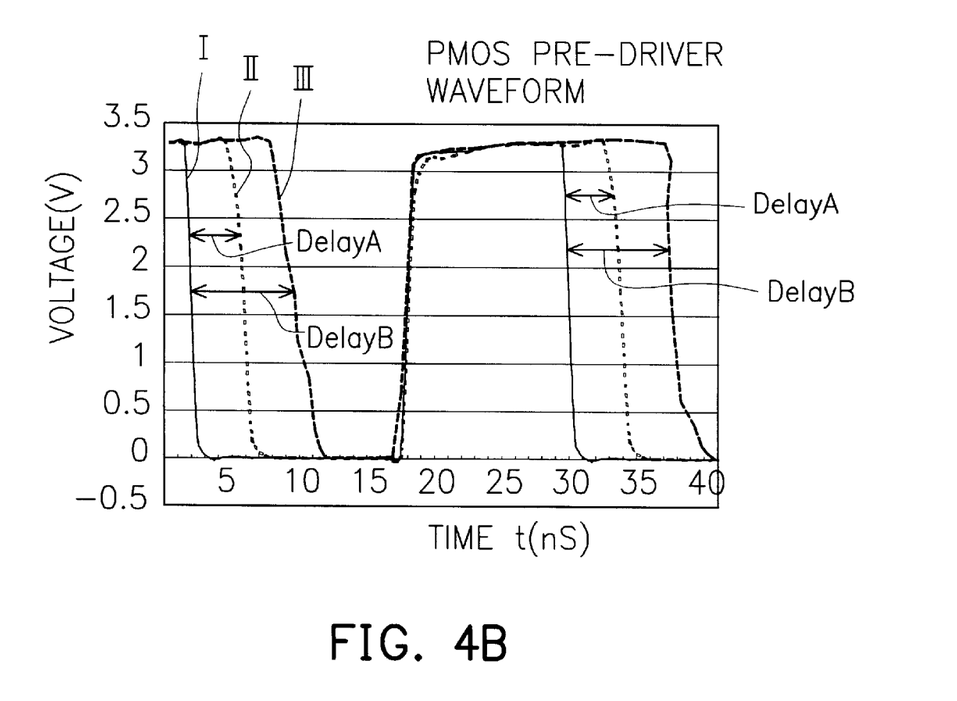
Figure 4C:
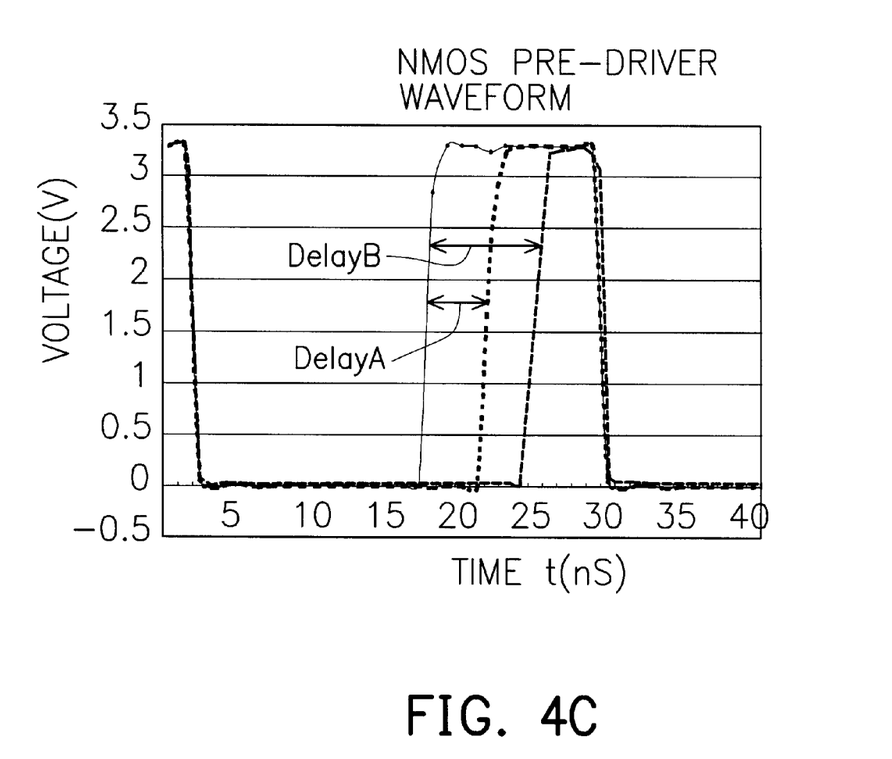

FIGS. 4A through 4C are graphs showing the results of simulating the circuits according to the embodiments of this invention. In FIG. 4A, the input and output waveforms of a programmable multi-configuration output buffer circuit are shown. The dash lines II and III represents output waveforms (delay) while solid line I represents an input waveform (without delay). FIGS. 4B and 4C show the output waveforms from the pre-driving stage of a PMOS and an NMOS transistor respectively. The effect of a delay on the waveform can be seen from the figures.

Figure 5A:
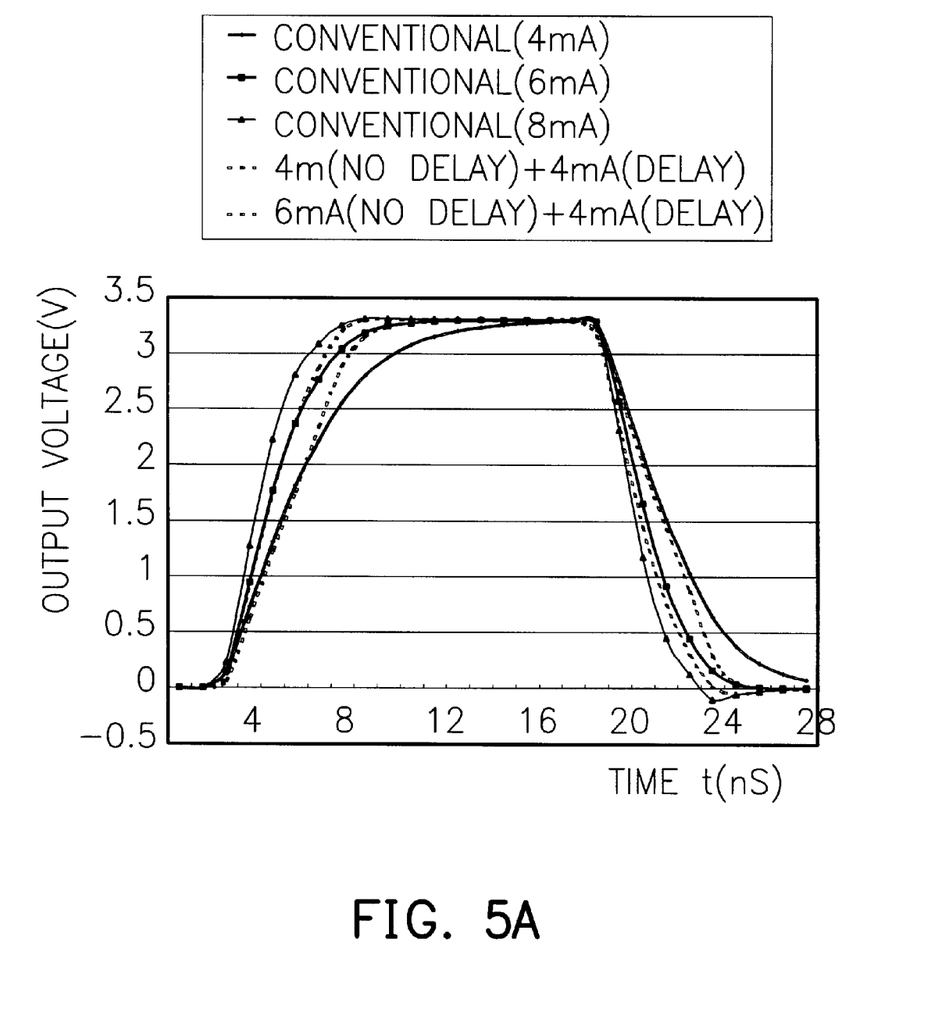
FIGS. 5A and 5B are graphs of resultant waveforms with or without due consideration to transmission line effect and corresponding output waveforms produced by a conventional circuit.
Figure 5B:
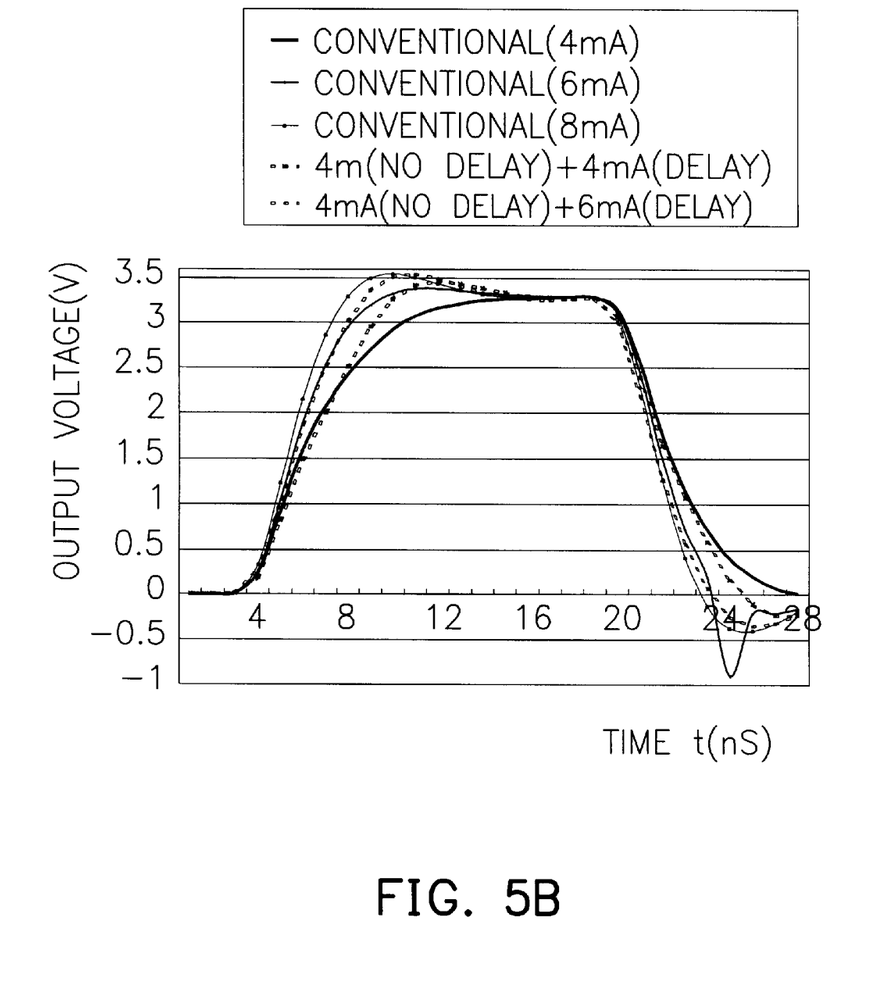

FIGS. 5A and 5B are graphs of resultant waveforms with or without due consideration of transmission line effect and corresponding output waveforms produced by a conventional circuit. In FIG. 5A, transmission line effect is ignored and a loading of 25 pF is applied. In FIG. 5B, transmission line effect is considered and a loading of 25 pF is applied.

In summary, this invention provides a programmable multi-configuration output buffer circuit with circuit characteristics that cannot be supplied by conventional circuits. For example, the relationship between input and output waveform for the buffer circuit can be found from FIGS. 4A, 5A and 5B. The output waveform produced by the output buffer circuit of this invention is highly symmetrical and linear. In addition, this invention provides a single circuit structure whose output impedance is low and has a small slew rate. Moreover, under identical output impedance condition, the circuit effectively lowers noise signals.

In conclusion, this invention has many advantages over a conventional circuit. The output buffer circuit of this invention supports a high driving capacity small impedance and a small driving capacity voltage slew rate concurrently. The output waveform from the circuit is highly symmetrical. The output buffer circuit can be adjusted to match with a low output impedance or a high output impedance so that noise levels are lowered. Moreover, a storage unit can be incorporated into the circuit so that on-chip programming can be conducted after IC fabrication. Hence, the output buffer can produce an output that closely matches a desired output specification and leads to a higher product yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An output buffer circuit having an input port terminal and an output port terminal, comprising:

an output buffer stage having no delay unit, wherein the output buffer stage includes a first type channel pull up transistor, a second type channel pull down transistor and a first logic circuit, the drain terminal of the first type channel pull up transistor and the drain terminal of the second type channel pull down transistor are connected together and also connected with the output port, and the first logic circuit receives an enable signal and an input signal; and at least one output buffer stage having a delay unit, wherein the output buffer stage includes a first type channel pull up transistor, a second type channel pull down transistor and a second logic circuit, the drain terminal of the first type channel pull up transistor and the drain terminal of the second type channel pull down transistor are connected together and also connected with the output port, and the second logic circuit receives an enable signal and an input signal;

wherein the second logic circuit further includes:
   a first inverter for receiving the input signal;
   a first NOR gate for receiving the enable signal and the inverted signal from the first inverter;
   a delay unit coupled to the output terminal of the first inverter;
   a first NAND gate for receiving the enable signal and the inverted signal from the first inverter;
   a second NAND gate for receiving the output from the first NOR gate and the delay unit, wherein the output terminal of the second NAND gate is coupled to the gate terminal of the first type channel pull up transistor of the output buffer stage having a delay unit therein; and
   a second NOR gate for receiving output from the first NAND gate and the delay unit, wherein the output terminal of the second NOR gate is coupled to the gate terminal of the second type channel pull up transistor of the output buffer stage having a delay unit therein.

2. The circuit of claim 1, wherein the first logic circuit further includes:

a NAND gate for receiving the enable signal and the input signal, wherein the output terminal of the NAND gate is coupled to the gate terminal of the first type channel pull up transistor of the output buffer stage having no delay unit;

an inverter for receiving the enable signal and inverting the enable signal; and a NOR gate for receiving the inverted output from the inverter and the input signal, wherein the output terminal of the NOR gate is coupled to the gate terminal of the second type channel pull up transistor of the output buffer stage having a delay unit therein.

3. A programmable multi-configuration output buffer circuit having an input port terminal and an output port terminal, comprising:

an output buffer stage having no delay unit, wherein the output buffer stage includes a first type channel pull up transistor, a second type channel pull down transistor and a first logic circuit, the drain terminal of the first type channel pull up transistor and the drain terminal of the second type channel pull down transistor are connected together and also connected with the output port, and the first logic circuit receives an enable signal and an input signal;

at least one output buffer stage having a delay unit, wherein the output buffer stage includes a first type channel pull up transistor, a second type channel pull down transistor and a second logic circuit, the drain terminal of the first type channel pull up transistor and the drain terminal of the second type channel pull down transistor are connected together and also connected with the output port, and the second logic circuit receives an enable signal, an input signal and corresponding select enable signal; and a storage unit for controlling output configuration that issue various select enable signals to corresponding output buffer stages having a delay unit therein so that a portion of the output buffer stages having a delay unit therein is triggered.

4. The circuit of claim 3, wherein the first logic circuit further includes:

a NAND gate for receiving the enable signal and the input signal, wherein the output terminal of the NAND gate is coupled to the gate terminal of the first type channel pull up transistor of the output buffer stage having no delay unit;

an inverter for receiving the enable signal and inverting the enable signal; and a NOR gate for receiving the inverted output from the inverter and the input signal, wherein the output terminal of the NOR gate is coupled to the gate terminal of the second type channel pull up transistor of the output buffer stage having a delay unit therein.

5. The circuit of claim 3, wherein the second logic circuit further includes:

a first NAND gate for receiving the enable signal and the select enable signal;
   a first inverter for receiving the input signal;
   a first NOR gate for receiving the output from the first NAND gate and the first inverter;
   a delay unit coupled to the output terminal of the first inverter;
   a second NAND gate coupled to the output of the first NAND gate;
   a third NAND gate for receiving the output from the first and the second inverter;
   a fourth NAND gate for receiving the output from the first NOR gate and the delay unit, wherein the output terminal of the fourth NAND gate is coupled to the gate terminal of the first type channel pull up transistor of the output buffer stage having a delay unit therein; and a second NOR gate for receiving the output from the third NAND gate and the delay unit, wherein the output terminal of the second NOR gate is coupled to the gate terminal of the second type channel pull up transistor of the output buffer stage having a delay unit therein.

6. The circuit of claim 5, wherein the delay unit further includes one or more delay circuits and a decoder, the delay circuits are serially connected, the output terminals of various delay circuits as well as the input terminal of the first delay circuit are coupled to the decoder, and the decoder includes one or more delay select signals for selecting and enabling a portion of the delay circuits.

7. The circuit of claim 5, wherein the delay unit further comprises of a first delay unit and a second delay unit, the first delay unit is coupled to the first inverter and the third NAND gate and the second delay unit is coupled to the first inverter and the second NOR gate.

8. The circuit of claim 7, wherein each first and second delay unit includes a plurality of delay circuits and a decoder, the delay circuits are serially connected together, the output terminals of various delay circuits and the input terminal of the first delay circuit are coupled to the decoder, and the decoder includes a plurality of delay select signal lines for selecting and enabling a portion of the delay circuits.

9. The circuit of claim 8, wherein the number of delay circuits for the first delay unit and the number of delay circuits for the second delay unit are identical.

10. The circuit of claim 8, wherein the number of delay circuits for the first delay unit and the number of delay circuits for the second delay unit are different.

11. The circuit of claim 8, wherein the storage unit for controlling output configuration further includes issuing delay select signals to the decoder.

* * * * *